(12) United States Patent
McQuirk et al.

(10) Patent No.: US 7,245,519 B2
(45) Date of Patent: Jul. 17, 2007

(54) DIGITALLY PROGRAMMABLE CAPACITOR ARRAY

(75) Inventors: Dale J. McQuirk, Austin, TX (US); Michael T. Berens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 123 days.

(21) Appl. No.: 11/209,117

(22) Filed: Aug. 22, 2005

(65) Prior Publication Data

US 2007/0040619 A1   Feb. 22, 2007

(51) Int. Cl.
*G11C 11/24* (2006.01)
*H03B 5/12* (2006.01)

(52) U.S. Cl. ............ 365/149; 331/36 C; 327/61; 323/242; 307/109

(58) Field of Classification Search ........ 365/149; 307/109; 323/242; 327/61; 331/36 C
See application file for complete search history.

(56) References Cited

U.S. PATENT DOCUMENTS

| | | | | |
|---|---|---|---|---|
| 4,618,852 A | * | 10/1986 | Kelley et al. | 341/127 |
| 5,111,204 A | * | 5/1992 | Katzenstein | 341/150 |
| 5,905,398 A | | 5/1999 | Todsen et al. | |
| 6,028,488 A | * | 2/2000 | Landman et al. | 331/1 A |
| 6,326,859 B1 | | 12/2001 | Goldman et al. | |
| 6,356,135 B1 | | 3/2002 | Rastegar | |
| 6,400,231 B1 | * | 6/2002 | Leduc et al. | 331/116 FE |
| 6,424,209 B1 | | 7/2002 | Gorecki et al. | |
| 6,686,213 B1 | | 2/2004 | Trimberger | |
| 6,903,615 B2 | * | 6/2005 | Landman et al. | 331/57 |

\* cited by examiner

*Primary Examiner*—Richard T. Elms
*Assistant Examiner*—Eric J. Wendler
(74) *Attorney, Agent, or Firm*—James L. Clingan, Jr.; Ranjeev Singh

(57) ABSTRACT

A programmable capacitor array does not require separate switching transistors because the capacitors themselves have a switchable capacitance, which capacitors are made in the manner of regular N channel transistors with their source/drains connected to each other. When a logic low is applied to the gate, the capacitance is relatively low and the capacitance is what is commonly called parasitic capacitance. The capacitance increases significantly when a logic high is applied to the gate because the logic high has the effect of inverting the channel. Thus, the capacitor array is made of transistors that themselves have switchable capacitance operated so that no separate switching transistors are required. This allows for construction of an array of unit capacitors to achieve monotonic operation and good linearity using conventional manufacturing of N channel transistors while achieving significant area savings and reduced power consumption.

19 Claims, 2 Drawing Sheets

DIGITALLY PROGRAMMABLE CAPACITOR ARRAY

FIELD OF THE INVENTION

This invention relates generally to circuits useful in integrated circuits, and more particularly to digitally programmable capacitor arrays.

RELATED ART

Digitally programmable capacitor arrays have been found to be particularly useful in controlling the frequency of oscillator circuits. The frequency is adjusted as needed by a multi-bit digital signal by altering the capacitance of a pair of capacitor arrays while maintaining a constant current flow into each of the two capacitor arrays. This has been effective but it does require a relatively large amount of silicon area in order to achieve monotonic operation, i.e., operation in which an increase in the request for more capacitance results in more capacitance every time. This is more difficult than it sounds at first because the capacitors that form one capacitance may not be any of the capacitors that make up the next incremental capacitance. One such example is when the most significant bit is switched to a logic high and all of the other bits are switched from a logic high to a logic low. For an 8 bit system this happens when the input goes from 127 to 128. In order to achieve monotonic operation and also better linearity, a unit capacitor is used for building up the capacitance. Thus for example, for the most significant bit in an eight bit system, there would be 128 unit capacitors along with 128 switching transistors. This also adds extra parasitic capacitance from the switches and the corresponding power increases from the added current required to charge the parasitic capacitance.

Thus, there is a need to overcome or improve upon one or more of the issues of area and power while maintaining monotonic operation and good linearity.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

In one aspect, a programmable capacitor array does not require separate switching transistors because the capacitors themselves have a switchable capacitance, which capacitors are made in the manner of regular N channel transistors with their source/drains connected to each other. When a logic low is applied to the gate, the capacitance is relatively low and the capacitance is what is commonly called parasitic capacitance. The capacitance increases significantly when a logic high is applied to the gate because the logic high has the effect of inverting the channel. Thus, the capacitor array is made of transistors that themselves have switchable capacitance operated so that no separate switching transistors are required. This allows for construction of an array of unit capacitors to achieve monotonic operation and good linearity using conventional manufacturing of N channel transistors while achieving significant area savings and reduced power consumption. This is better understood with reference to the FIGs. and the following description.

Figure 1:
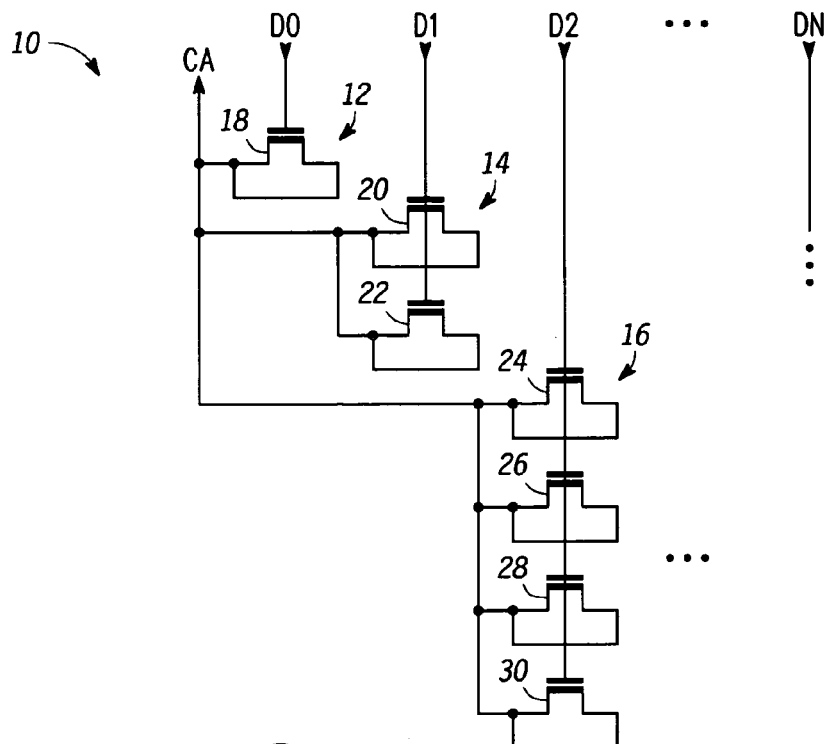
FIG. 1 is a circuit diagram of a capacitor array according to an embodiment of the invention.

Shown in FIG. 1 is a capacitor array 10 comprising a capacitance 12, a capacitance 14, and a capacitance 16. Capacitance 12 comprises an N channel transistor 18. Capacitance 14 comprises N channel transistors 20 and 22. Capacitance 16 comprises N channel transistors 24, 26, 28, and 30. Transistor 12 has a gate for receiving a digital signal D0 and source/drains connected to each other and to a capacitor terminal that has an array capacitance CA. Transistors 20 and 22 each have their gates for receiving a digital signal D1 and their source/drains connected to each other and to the capacitor terminal. Transistors 24, 26, 28, and 30 each have their gates for receiving a digital signal D2 and their source/drains connected to each other and to the capacitor terminal.

Digital signals D0, D1, and D2 are three signals representative of the first three bits of a multi-bit signal, beginning with the least significant bit. Digital signal DN is representative of the most significant bit of the multi-bit signal. Each of the N channel transistors 18, 20, 22, 24, 26, 28, and 30 are made to be the same as much as is reasonably possible. Each is thus considered a unit capacitance. The number of these N channel transistors that are connected to a particular digital signal of the multi-bit signal is based on what that particular data signal represents. Each digital signal represents twice the amount of the signal immediately preceding it. As shown, digital signal D1 is connected to twice as many capacitance units as is digital signal D0. Similarly, digital signal D2 is connected to twice as many as is digital signal D1. This continues until the most significant bit is reached. In this example of the multi-bit signal being an eight bit signal, digital signal DN would be D7 and would have two to the 7th ($2^7$=128) transistors connected to it. This is a binary weighted capacitor approach in which each digital signal enables its corresponding weight in unit capacitance. The ability to replicate unit capacitance is high by providing identical transistors for the unit capacitance.

In operation, the multi-bit signal is received by capacitor array 10 and capacitor array 10 responds by providing a capacitance that corresponds to the value or count of the multi-bit signal. For the capacitances that are chosen by the multi-bit signal for being included, the transistors that comprise those chosen capacitances receive a logic high. Thus, for example, if signal D2 is a logic high and the other signals such as D0 and D1 are a logic low, then a value of 4 is selected and the four transistors 24, 26, 28, and 30 receive a logic high on their gates. This places transistors 24, 26, 28, and 30 into a relatively high capacitance state. Capacitor array 10 has a minimum capacitance that is increased by transistors being selected. The minimum capacitance includes the parasitic capacitances of all of the transistors that make up capacitor array 10. If this parasitic capacitance is not sufficient to meet the desired minimum capacitance, other fixed capacitances not shown can be added to provide the desired minimum capacitance. In this example of signal D2 being a logic high, the increased capacitance states of transistors 24, 26, 28, and 30 is added to the minimum capacitance.

Figure 2:
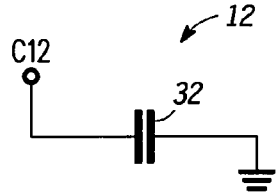
FIG. 2 shows the effective circuit diagram of one of the capacitor elements in a first state.

Shown in FIG. 2 is the capacitance 32 provided by capacitance 12 when transistor 18 receives a logic low on its gate. Capacitance 32 is a sum of the various parasitic capacitances of an N channel transistor. An N channel transistor has its source/drains and channel region in a substrate that is connected to a fixed voltage, which is often ground. In such case, the parasitic capacitances are primarily between the source/drains and the substrate and the source/drains and the gate.

Figure 3:
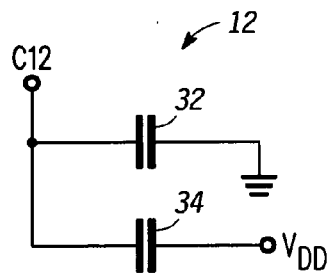
FIG. 3 shows the effective circuit diagram of one of the capacitor elements in a second state.

Shown in FIG. 3 is capacitance 12 for the case where transistor 18 receives a logic high on its gate. In such case there is a channel capacitance 34 that is in effect in parallel to the parasitic capacitance 32. Channel capacitance 34 results from digital signal D1 exceeding the threshold voltage of transistor 18 and inverting its channel. The amount of added capacitance is primarily a function of the area of the channel and the gate dielectric material and thickness. The gate dielectric in this example is silicon dioxide which is common for N channel transistors as well as P channel transistors. Although capacitances 32 and 34 are not strictly in parallel, the effect is as if they were because they both have one terminal connected to the capacitor terminal of capacitor array 10 and the other terminal connected to a fixed voltage. At a logic one, digital signal D0 is preferably at VDD, but another voltage could also be effective.

Figure 4:
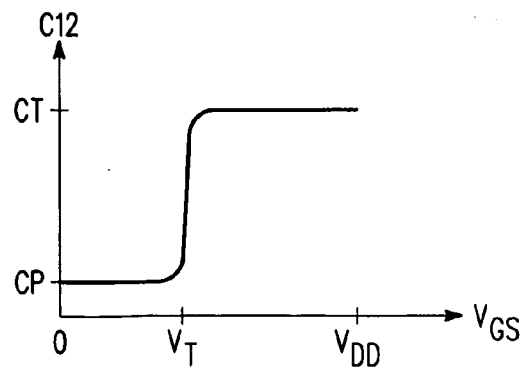
FIG. 4 is a graph useful in understanding the operation of the capacitor array of FIG. 1.

Shown in FIG. 4 is a graph showing the relevant capacitor curve in response to a gate to source/drain voltage. At voltages near zero, the capacitance is just the parasitic capacitance and varies little with gate voltage. As the gate voltage increases to near the threshold voltage, shown as VT, the capacitance increases rapidly to a relatively fixed channel capacitance. The transition is called weak inversion. Past the weak inversion, the channel capacitance varies little with gate voltage after the threshold voltage has been sufficiently exceeded and that is called strong inversion. The mode in which the channel is not inverted is called the accumulation mode. Thus, the high capacitance state occurs when the transistor is in the strong inversion mode an the low capacitance state when in the accumulation mode.

Figure 5:
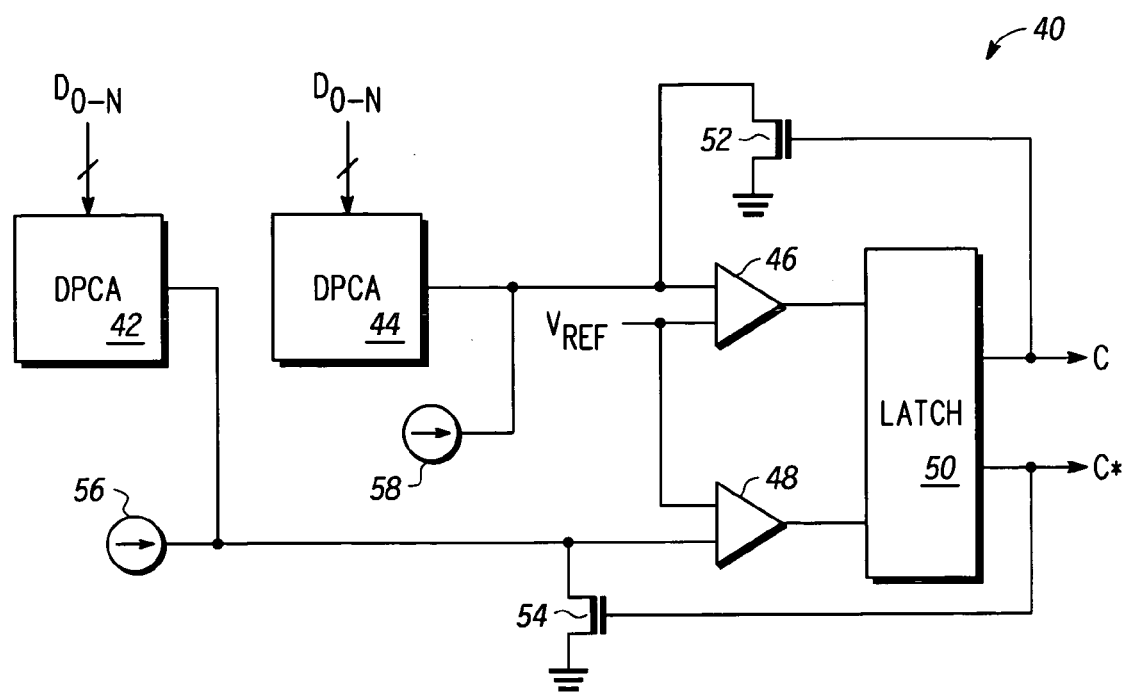
FIG. 5 is block diagram of an oscillator using the capacitor array of FIG. 1.

Shown in FIG. 5 is a relaxation oscillator 40 comprising a digitally programmable capacitor array (DPCA) 42, a DPCA 44, a comparator 46, a comparator 48, a latch 50, an N channel transistor 52, an N channel transistor 54, a current source 56, and a current source 58. DPCAs 42 and 44 are constructed the same as capacitor array 10 of FIG. 1. DPCA 42 has an input for receiving multi-bit signal D0-N and a capacitor terminal. DCPA 44 has an input for receiving digital signal D0-N and a capacitor terminal. The capacitor terminals of each of DCPAs 42 and 44 provide a capacitance, which is selected by multi-bit signal D0-N, to a fixed reference and/or fixed references such as VDD and ground. Comparator 46 has a first input connected to the capacitor terminal of DPCA 44, a second input connected to a voltage reference, and an output. Comparator 48 has a first input connected to the capacitor terminal of DPCA 42, a second input connected to the reference voltage, and an output. Latch 50 has a first input connected to the output of comparator 46, a second input connected to the output of comparator 48, a true output clock C, and a complementary output clock C*. Transistor 52 has a gate connected to the true output clock C of latch 50, a source connected to ground, and a drain connected to the capacitor terminal of DPCA 44. Transistor 54 has a gate connected to the complementary clock output of latch 50, a source connected to ground, and a drain connected to the capacitor terminal of DPCA 42. Current source 56 has an output connected to the capacitor terminal of DPCA 42. Current source 58 has an output connected to the capacitor terminal of DPCA 44.

In operation, latch 50 provides complementary outputs so that one will initially be a logic high and the other a logic low. Assuming that true output clock C is initially a logic high, transistor 52 is conductive and keeps the capacitance terminal of DPCA 44 grounded while transistor 54 is non-conductive. Current source 56 begins charging the capacitance of DPCA 42 as selected by digital signal D0-N causing the voltage at the first input of comparator 48 to rise. This rising continues until it exceeds the reference voltage which causes comparator 48 to flip states to provide a logic high output. This in turn causes latch 50 to flip states so that true output clock C becomes a logic low and complementary output clock C* provides a logic high output. This causes transistor 52 to become non-conductive and transistor 54 to become conductive. With transistor 52 non-conductive, current source 58 begins charging the capacitance of DPCA 44 while transistor 54 discharges the capacitance of DPCA 42 to ground and thereby bringing the first input of comparator 48 to ground as well. Latch 50, which in this example is an SR latch, does not change state in response to comparator 48 switching to a logic low output. The capacitance of DPCA 44 continues being charged to increase the voltage on the first input of comparator 46 until the voltage exceeds the reference voltage. This causes comparator 46 to flip states to provide a logic high output. This causes latch 50 to flip states and provide true output clock C as a logic high and complementary output clock C* as a logic low. Complementary output clock C* switching to a logic low causes transistor 52 to become non-conductive so that current source 58 can begin charging the capacitance of DPCA 44. Complementary output clock C* at a logic high causes transistor 54 to become conductive and thereby cause the first input of comparator 46 to become a logic low and comparator 46 to provide a logic low as well. This change of state of the output of comparator 46 does not cause a change in state for latch 50 because it is an SR latch. The continued alternate charging and discharging of DPCAs 42 and 44 provides for an oscillator output in which the period is the sum of the time to charge the capacitance of DPCA 42 to the reference voltage plus the time to charge the capacitance of DPCA 44 to the reference voltage. Other ways of achieving the overall comparison function, the portion of the oscillator 40 represented by comparators 46 and 48, transistors 52 and 54, and latch 50, may be implemented as an alternative.

With DPCAs 42 and 44 not requiring separate switching transistors in addition to capacitors, much area is saved while maintaining monotonic operation with good linearity due to being able to use a unit capacitance approach. Also because the minimum capacitance may actually have to be increased beyond the parasitic capacitance, capacitance is at the minimum for the dynamic capacitance range desired. This results in power savings.

Various changes and modifications to the embodiments herein chosen for purposes of illustration will readily occur to those skilled in the art. For example, N type transistors were described as being preferred but P channel transistors may also be used, including the transistors in the DPCAs. The use of the DPCAs was described in the context of an oscillator but other uses may also be implemented such as in a filter or an analog timer. To the extent that such modifications and variations do not depart from the spirit of the invention, they are intended to be included within the scope thereof which is assessed only by a fair interpretation of the following claims.

What is claimed is:

1. A digitally programmable capacitor array comprising:
an array of digitally selectable transistors configured as a plurality of binary weighted capacitors, wherein each of the digitally selectable transistors of the array has a first state and a second state selected by an input coupled to a gate electrode of each of the digitally selectable transistors of the array, wherein each of the digitally selectable transistors of the array having a low capacitance or a high capacitance based on whether a respective transistor is in the first state or the second state.

2. The digitally programmable capacitor array of claim 1, wherein the first state corresponds to the respective transistor being in an accumulation mode.

3. The digitally programmable capacitor array of claim 1, wherein the second state corresponds to the respective transistor being in a strong inversion mode.

4. The digitally programmable capacitor array of claim 1, wherein the low capacitance relates to at least a parasitic capacitance of the respective transistor.

5. The digitally programmable capacitor array of claim 1, wherein the high capacitance relates to at least a combination of a parasitic capacitance of the respective transistor and a channel to gate capacitance of the respective transistor.

6. The digitally programmable capacitor array of claim 1, wherein each of the array of digitally selectable transistors is an N channel transistor.

7. The digitally programmable capacitor array of claim 1, wherein each of the array of digitally selectable transistors is a P channel transistor.

8. The digitally programmable capacitor array of claim 1 further comprising at least one transistor configured as a fixed capacitor coupled in parallel with the array of digitally selectable transistors.

9. A digitally programmable oscillator comprising:
a first digitally programmable capacitor array comprising a first array of digitally selectable transistors, wherein the first array of digitally selectable transistors is configured as a first plurality of binary weighted capacitors, wherein each of the digitally selectable transistors of the first array has a first state and a second state selected by an input coupled to a gate electrode of each of the digitally selectable transistors of the first array, wherein each of the digitally selectable transistors of the first array having a low capacitance or a high capacitance based on whether a respective transistor is in the first state or the second state;
a second digitally programmable capacitor array comprising a second array of digitally selectable transistors, wherein the second array of digitally selectable transistors is configured as a second plurality of binary weighted capacitors, wherein each of the digitally selectable transistors of the second array has a first state and a second state selected by an input coupled to a gate electrode of each of the digitally selectable transistors of the second array, wherein each of the digitally selectable transistors of the second array having a low capacitance or a high capacitance based on whether a respective transistor is in the first state or the second state; and
a current source for generating a reference current, wherein the reference current is supplied to the first digitally programmable capacitor array to generate a first input to a comparison circuit, and wherein the reference current is supplied to the second digitally programmable capacitor array to generate a second input to the comparison circuit, and wherein the comparison circuit generates a clock signal and a complementary clock signal, and wherein the clock signal is fed back to the first input to the comparison circuit and the complementary clock signal is fed back to the second input to the comparison circuit.

10. The digitally programmable oscillator of claim 9, wherein the first state corresponds to the respective transistor being in an accumulation mode.

11. The digitally programmable oscillator of claim 9, wherein the second state corresponds to the respective transistor being in a strong inversion mode.

12. The digitally programmable oscillator of claim 9, wherein the low capacitance relates to at least a parasitic capacitance of the respective transistor.

13. The digitally programmable oscillator of claim 9, wherein the high capacitance relates to at least a combination of a parasitic capacitance of the respective transistor and a channel to gate capacitance of the respective transistor.

14. The digitally programmable oscillator of claim 9, wherein each of the array of digitally selectable transistors is an N channel transistor.

15. The digitally programmable oscillator of claim 9, wherein each of the array of digitally selectable transistors is a P channel transistor.

16. The digitally programmable oscillator of claim 9 further comprising at least one transistor configured as a fixed capacitor coupled in parallel with the array of digitally selectable transistors.

17. A digitally programmable timer comprising:
an array of digitally selectable transistors configured as a plurality of binary weighted capacitors, wherein each of the digitally selectable transistors of the array has a first state and a second state selected by an input coupled to a gate electrode of each of the digitally selectable transistors of the array, wherein each of the digitally selectable transistors of the array having a low capacitance or a high capacitance based on whether a respective transistor is in the first state or the second state;
a current source for providing a reference current; and
a timing circuit coupled to the array of digitally selectable transistors to receive a voltage across the digitally selectable array of transistors as an input, wherein the reference current charges the array of digitally selectable transistors, such that the timing circuit produces an output signal with a delay dependent on at least a capacitance of the array of digitally selectable transistors.

18. The digitally programmable timer of claim 17, wherein the low capacitance relates to at least a parasitic capacitance of the respective transistor.

19. The digitally programmable timer of claim 17, wherein the high capacitance relates to at least a combination of a parasitic capacitance of the respective transistor and a channel to gate capacitance of the respective transistor.

* * * * *